US009910943B2

(12) United States Patent
Meyer et al.

(10) Patent No.: US 9,910,943 B2
(45) Date of Patent: Mar. 6, 2018

(54) DISTRIBUTED STATE AND DATA FUNCTIONAL COVERAGE

(71) Applicant: Mentor Graphics Corporation, Wllsonville, OR (US)

(72) Inventors: Andreas Meyer, Newburyport, MA (US); Gustav Bjorkman, Malmo (SE); Avidan Efody, Rosh Haayin (IL)

(73) Assignee: Mentor Graphics Corporation, Wilsonville, OR (US)

( * ) Notice: Subject to any disclaimer, the term of this patent is extended or adjusted under 35 U.S.C. 154(b) by 1010 days.

(21) Appl. No.: 14/169,418

(22) Filed: Jan. 31, 2014

(65) Prior Publication Data

US 2015/0213170 A1  Jul. 30, 2015

Related U.S. Application Data

(63) Continuation of application No. 14/168,722, filed on Jan. 30, 2014.

(51) Int. Cl.
*G06F 17/50* (2006.01)

(52) U.S. Cl.
CPC ...... *G06F 17/5022* (2013.01); *G06F 17/5009* (2013.01)

(58) Field of Classification Search
USPC ................................................ 703/2, 17, 20
See application file for complete search history.

(56) References Cited

U.S. PATENT DOCUMENTS

| 6,735,747 | B2* | 5/2004 | Watkins | G06F 17/5022 703/14 |
| 7,007,251 | B2* | 2/2006 | Hekmatpour | G01R 31/31835 703/13 |
| 7,467,364 | B2* | 12/2008 | Hekmatpour | G01R 31/31835 716/106 |
| 8,346,692 | B2* | 1/2013 | Rouat | G06K 9/4623 706/20 |
| 2003/0229864 | A1* | 12/2003 | Watkins | G06F 17/5022 716/106 |
| 2005/0102596 | A1* | 5/2005 | Hekmatpour | G01R 31/31835 714/741 |
| 2006/0107141 | A1* | 5/2006 | Hekmatpour | G01R 31/31835 714/724 |
| 2014/0019048 | A1* | 1/2014 | Chabot-Couture | G06F 15/00 702/3 |
| 2014/0019065 | A1* | 1/2014 | Chabot-Couture | G06F 15/00 702/24 |

* cited by examiner

*Primary Examiner* — Thai Phan
(74) *Attorney, Agent, or Firm* — Mentor Graphics Corporation

(57) ABSTRACT

This application discloses a computing system to implement a design verification tool and simulate a circuit design with a test bench. The computing system can correlate transactions captured during simulation of a circuit design to distributed states for multiple components in the circuit design. The computing system can identify at least a portion of the distributed states for the multiple components correspond to system level coverage events. The computing system can generate a graphical presentation to illustrate the portion of the distributed states for the multiple components in the circuit design that correspond to system level coverage events.

20 Claims, 10 Drawing Sheets

DISTRIBUTED STATE AND DATA FUNCTIONAL COVERAGE

RELATED APPLICATION

This application is a continuation of and claims priority to U.S. patent application Ser. No. 14/168,722, filed Jan. 30, 2014, which is incorporated by reference herein.

TECHNICAL FIELD

This application is generally related to electronic design automation and, more specifically, to distributed state and data functional coverage.

BACKGROUND

Microdevices, such as integrated microcircuits and microelectromechanical systems (MEMS), are used in a variety of products, from automobiles to microwaves to personal computers. Designing and fabricating microdevices typically involves many steps, known as a "design flow." The particular steps of a design flow often are dependent upon the type of microcircuit, its complexity, the design team, and the microdevice fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows for integrated microcircuits. Initially, the specification for a new circuit is transformed into a logical design, sometimes referred to as a register transfer level (RTL) description of the circuit. With this logical design, the circuit can be described in terms of both the exchange of signals between hardware registers and the logical operations that can be performed on those signals. The logical design typically employs a Hardware Design Language (HDL), such as the Very high speed integrated circuit Hardware Design Language (VHDL). As part of the creation of a logical design, a designer will also implement a place-and-route process to determine the placement of the various portions of the circuit, along with an initial routing of interconnections between those portions. The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices, such as transistors, resistors, and capacitors, which will be used in the circuit, along with their interconnections. This device design generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the desired functions. This analysis is sometimes referred to as "formal verification."

Once the relationships between circuit devices have been established, the design can be again transformed, this time into a physical design that describes specific geometric elements. This type of design often is referred to as a "layout" design. The geometric elements, which typically are polygons, define the shapes that will be created in various materials to manufacture the circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Typically, a designer will perform a number of analyses on the resulting layout design data. For example, with integrated circuits, the layout design may be analyzed to confirm that it accurately represents the circuit devices and their relationships as described in the device design. The layout design also may be analyzed to confirm that it complies with various design requirements, such as minimum spacings between geometric elements. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes, that modify the layout design data to improve the usable resolution of the reticle or mask created from the design in a photolithographic manufacturing process.

After the layout design has been finalized, it is converted into a format that can be employed by a mask or reticle writing tool to create a mask or reticle for use in a photolithographic manufacturing process. The written masks or reticles then can be used in a photolithographic process to expose selected areas of a wafer to light or other radiation in order to produce the desired integrated microdevice structures on the wafer.

Returning to "functional verification," this type of analysis begins with a circuit design coded at a register transfer level (RTL), which can be simulated by a design verification tool. A designer, for example, utilizing the design verification tool, can generate a test bench that can allow the design verification tool to analyze or verify the functionality of the simulated circuit design. Since it is often impractical to perform functional verification utilizing test benches that cover every possible operation for the simulated circuit design, many designers develop test benches that provide just a subset of possible input vectors to the simulated circuit design.

The design verification tool can attempt to identify how well those test benches came to covering or adequately exercising the simulated circuit design. Conventional techniques to determine test bench coverage of the circuit design include code coverage and functional coverage. Code coverage, such as statement coverage, decision coverage, condition coverage, expression coverage, or the like, can identify which lines, statements, expressions, decisions, in the code of the circuit design were exercised by the test bench during simulation. Functional coverage can quantify how well a test bench came to covering or adequately exercising functionality in the simulated circuit design. For example, a circuit design having a cache system can be deemed fully covered by conventional coverage techniques when each cache in the cache system enters every "legal" operational state in response to every "legal" event or transaction.

SUMMARY

This application discloses tools and mechanisms for distributed state and data functional coverage in a circuit design. According to various embodiments, the tools and mechanisms can simulate a circuit design utilizing a test bench, and identify multiple components in the circuit design to combine for distributed state coverage analysis based, at least in part, on data transactions generated during the simulation of the circuit design. The tools and mechanisms can correlate information captured during simulation that corresponds to the identified components. The correlated information can identify at least one distributed state coverage event for the test bench. The tools and mechanisms can generate a distributed state coverage metric based on the correlated information corresponding to the identified components. The tools and mechanisms can prompt presentation of the correlated information a display window, which can graphically show how a test bench exercised the identified components during simulation.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads.

Figure 1:
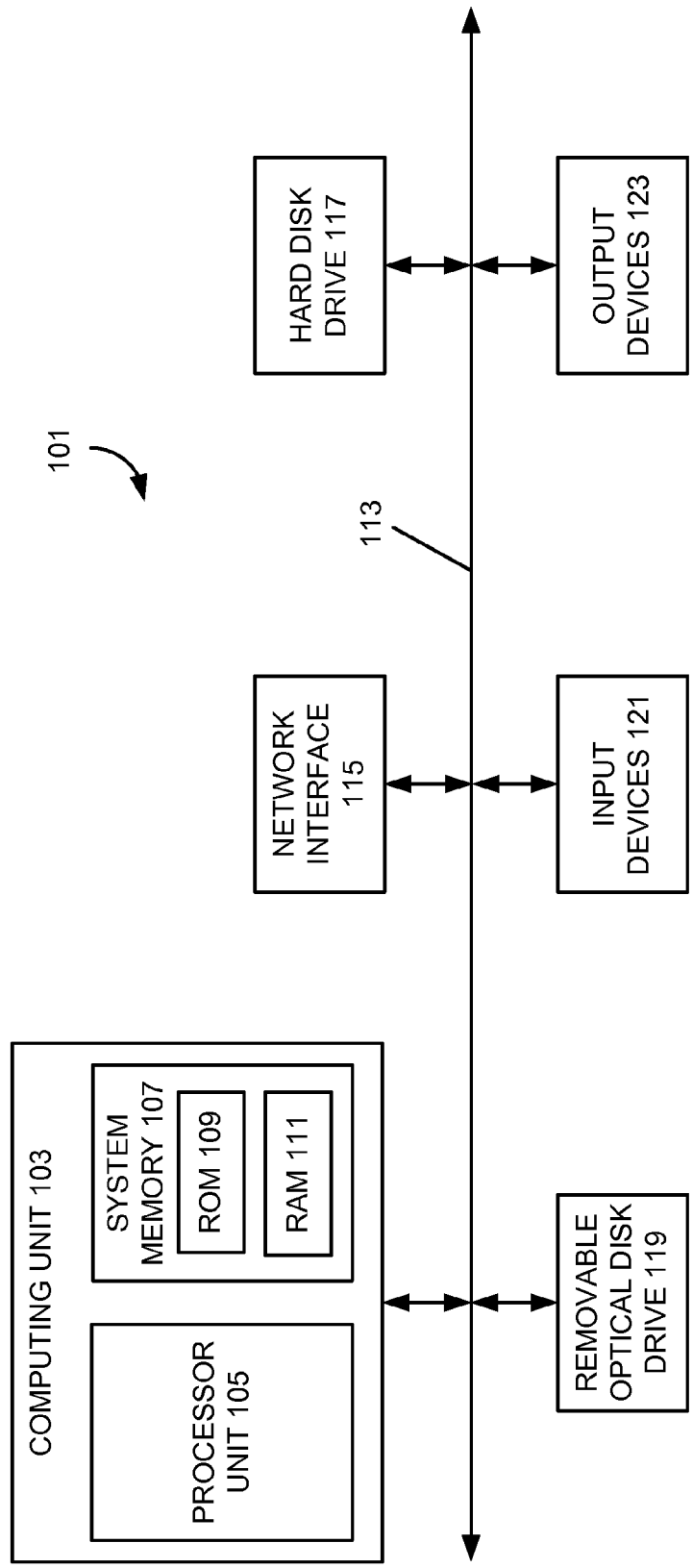
FIGS. 1 and 2 illustrate an example of a computer system of the type that may be used to implement various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
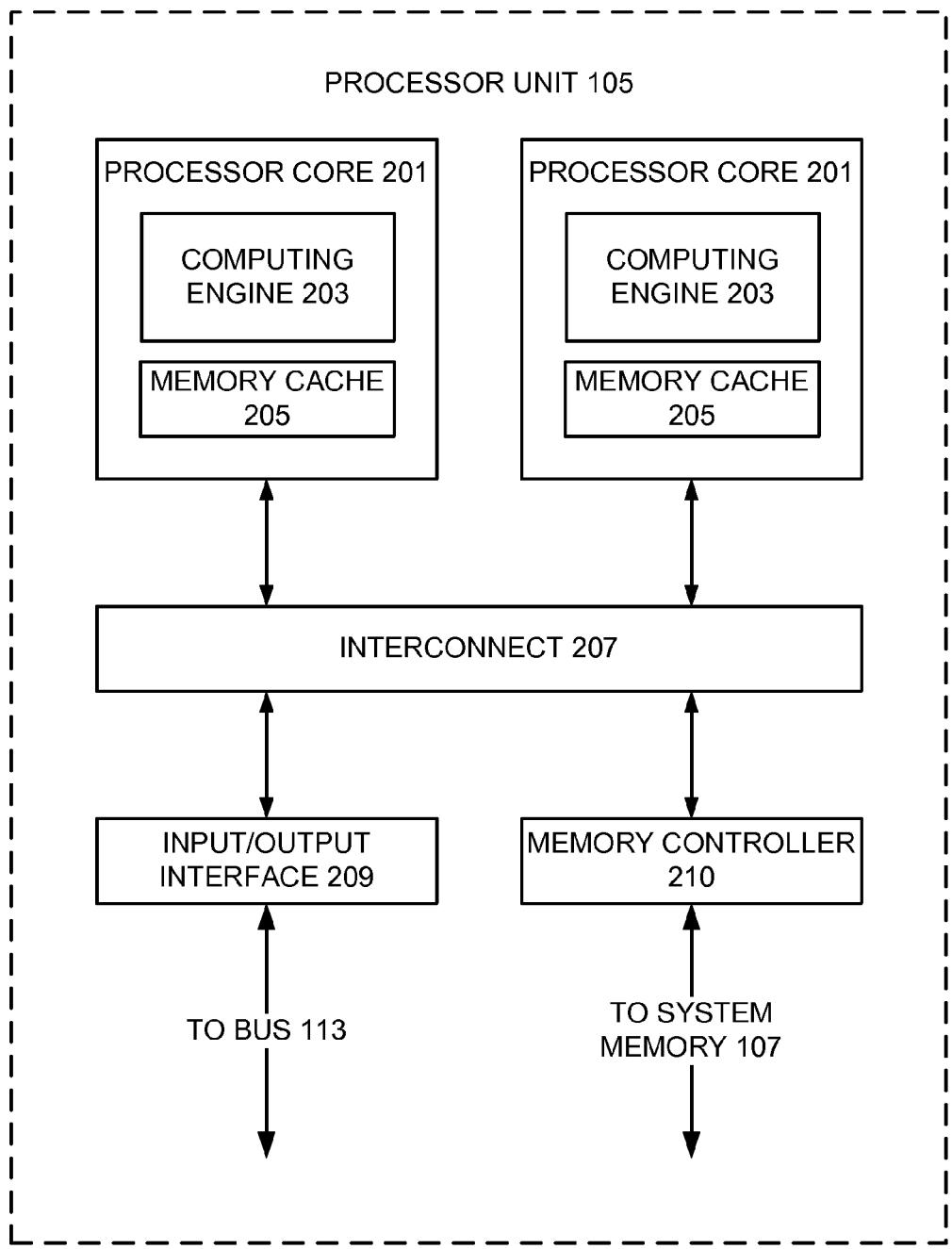

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 113. Similarly, the memory controller 211 controls the exchange of information between the processor unit 201 and the system memory 107. With some implementations of the invention, the processor units 201 may include additional components, such as a high-level cache memory accessible shared by the processor cores 201.

It also should be appreciated that the description of the computer network illustrated in FIG. 1 and FIG. 2 is provided as an example only, and it not intended to suggest any limitation as to the scope of use or functionality of alternate embodiments of the invention.

Design Verification Tool with Distributed State Coverage

Figure 3:
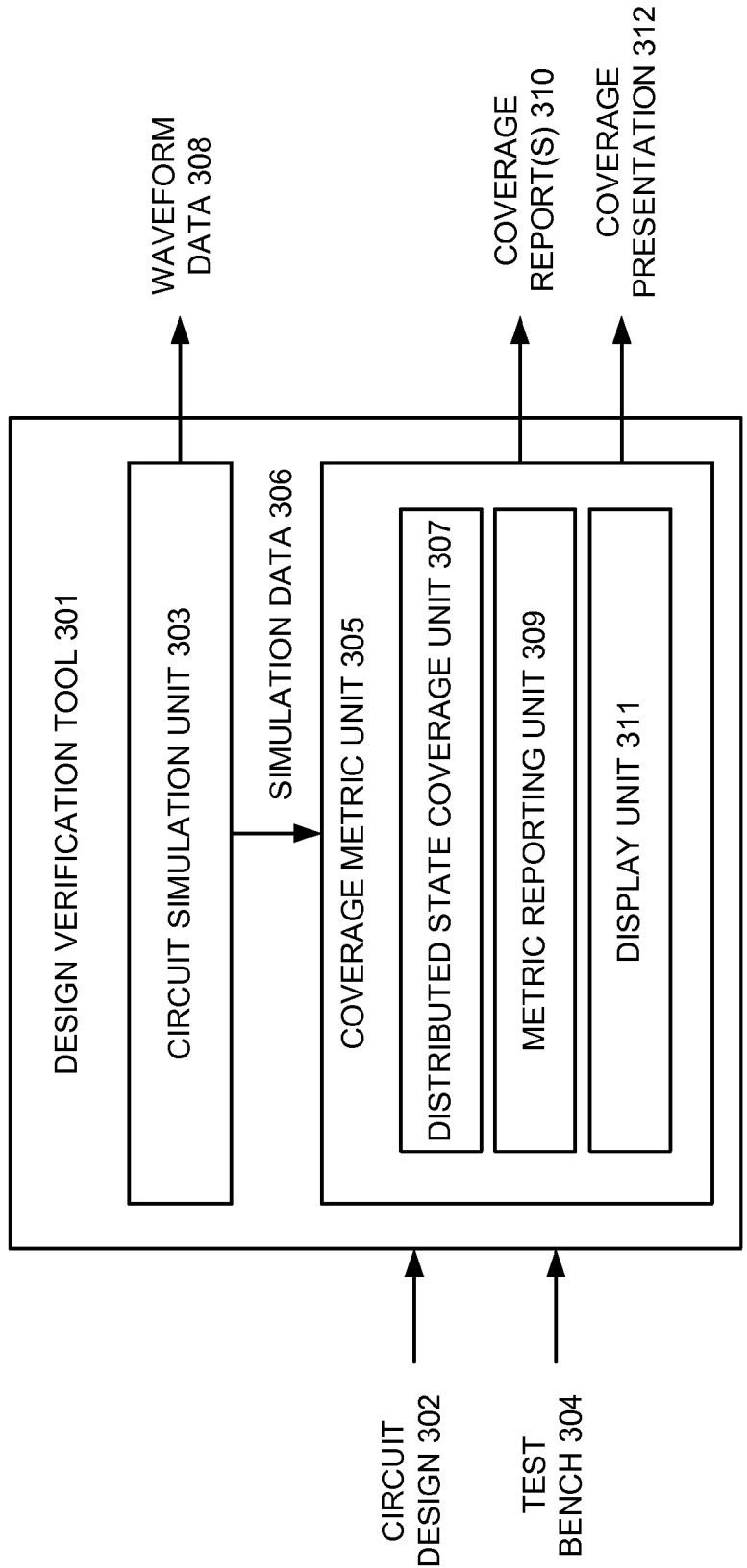
FIG. 3 illustrates an example of a design verification tool including a distributed state coverage unit that may be implemented according to various embodiments of the invention.

FIG. 3 illustrates an example of a design verification tool including a distributed state coverage unit that may be implemented according to various embodiments of the invention. Referring to FIG. 3, the design verification tool 301 can receive a circuit design 302, which can describe an electronic device both in terms of an exchange of data signals between components in the electronic device, such as hardware registers, flip-flops, combinational logic, or the like, and in terms of logical operations that can be performed on the data signals in the electronic device. The circuit design 302 can model the electronic device at a register transfer level (RTL), for example, with code in a hardware description language (HDL), such as Verilog, Very high speed integrated circuit Hardware Design Language (VHDL), or the like. In some embodiments, the design verification tool 301 can receive the circuit design 302 from a source external to the design verification tool 301, such as a user interface of the computing device 101, another tool implemented by the computing device 101, or the design verification tool 301 may internally generate the circuit design 302.

The design verification tool 301 can receive a test bench 304, which during simulation, can generate a set of test stimuli capable of being utilized to functionally verify the circuit design 302, for example, by providing test scenarios to determine whether the circuit design 302 can function as expected. In some embodiments, the design verification tool 301 can receive the test bench 304 from a source external to the design verification tool 301, such as a user interface of the computing device 101, another tool implemented by the computing device 101, or the design verification tool 301 may internally generate the test bench 304.

The design verification tool 301 can include a circuit simulation unit 303 to simulate the circuit design 302 based, at least in part, on the test bench 304. The circuit simulation unit 303 can generate waveform data 308, which can correspond to a simulated output created by the circuit design 302 during simulation with the test bench 304. The design verification tool 301 (or a tool external to the design verification tool 301) can perform functional verification for the circuit design 302, for example, by comparing the waveform data 308 with an expected output from the circuit design 302 in response to test stimuli generated by the test bench 304 during simulation.

The design verification tool 301 can include a coverage metric unit 305 to collect simulation data 306, for example, by monitoring the circuit design 302 during simulation, receiving the simulation data 306 from a results database, or the like. In some embodiments, the simulation data 306 can include information corresponding to data signals or data transactions communicated in the circuit design 302 during simulation, a timing of the data signal or data transaction communication, an identification of the components in the circuit design 302 transmitting and receiving the data signals, the various operational states of those components, or the like.

The coverage metric unit 305 can utilize the simulation data 306 to determine how the test bench 304 exercised the circuit design 302 during simulation. For example, when the circuit design 302 includes multiple caches, the coverage metric unit 305 can review the simulation data 306 to identify which operational state transitions the individual caches made during simulation in response to input vectors from the test bench 304 and which events or transactions prompted those operational state transitions. Although FIG. 3 shows the coverage metric unit 305 as separate from the circuit simulation unit 303, in some embodiments, the coverage metric unit 305 may be included in the circuit simulation unit 303.

The coverage metric unit 305 can include a distributed state coverage unit 307 to extend functional coverage of the test bench 304, for example, to determine whether the test bench 304 covered distributed states of multiple functionally-interrelated components. The distributed state coverage unit 307 can analyze the data transactions in the simulation data 306 to determine when two or more components become functionally-interrelated during simulation, and then record the operational states for the components while the components are functionally-interrelated, the combination of which can be called distributed states. In some embodiments, the distributed states also can consider a timing of when the two or more components become functionally-interrelated or the relative timing between operations of the two or more components that renders them functionally-interrelated. The distributed state coverage unit 307 also can record events prompting distributed state transitions of the functionally-interrelated components. The distributed states and corresponding events prompting distributed state transitions recorded by the distributed state coverage unit 307 can be utilized to show functional coverage by the test bench 304 of multiple component subsystems within the circuit design 302 that become functionally-interrelated dynamically in response to data transactions or other events generated during simulation of the circuit design 302.

For instance, when the circuit design 302 includes multiple caches capable of sharing data from a memory device in the circuit design 302, the distributed state coverage unit 307 can analyze data transactions in the simulation data 306 to determine whether two or more of the caches shared data from a common physical address in the memory device. When two or more of the caches share data from a common physical address in the memory device, the distributed state coverage unit 307 can record combined operational states (or distributed states) of the two or more caches made while they were sharing data from the memory device, which events or transactions prompted transition into those combined operational states, and optionally a timing between the events or transactions that prompted transition into those combined operational states.

In some examples, when the circuit design 302 includes hardware linked-lists capable of population with data during simulation, the distributed state coverage unit 307 can analyze data transactions in the simulation data 306 to determine operational states of one or more hardware linked-lists. The operational states of the one or more hardware linked-lists can be based on the data stored in various entries within the one or more hardware linked-lists, whether one hardware linked-list is linked to another hardware linked-list, or the like. The distributed state coverage unit 307 can record combined operational states (or distributed states) for the one or more hardware linked-lists and which events or transactions prompted entry into those distributed states.

By analyzing the data transactions or other events in the simulation data 306, the distributed state coverage unit 307 can cover sub-systems in the circuit design 302 whose state can be dependent upon data with the data transactions or other events in the simulation data 306. Embodiments of distributed state functional coverage will be described below in greater detail.

The coverage metric unit 305 can include a metric reporting unit 309 to generate one or more coverage reports 310 including one or more coverage metrics to indicate how the test bench 304 exercised the circuit design 302 during simulation, for example, which can be utilized to determine whether the test bench 304 satisfies a predetermine specification. The one or more coverage reports 310 can include coverage metrics to convey how well the test bench 304 came to covering individual components in the circuit design 302, include distributed state functional coverage metrics to convey how well the test bench 304 came to covering distributed state component sub-systems in the circuit design 302, or the like. The distributed state functional coverage metrics can be a percentage of or an indication of whether components became functionally-interrelated during simulation, a percentage of the distributed states the functionally-interrelated components in the circuit design 302 completely and/or partially covered during simulation with the test bench 304, or the like.

The coverage metric unit 305 can include a display unit 311 to generate a coverage presentation 312, for example, which can prompt presentation of distributed state functional coverage-related information for the functionally-interrelated components in a display window. In some embodiments, the coverage presentation 312 can be a table or graphical display populated with simulation data 306 corresponding to components in the circuit design 302 that became functionally-interrelated during simulation. The simulation data 306 can include the distributed states the functionally-interrelated components covered during simulation, the events prompting transition into the corresponding distributed states, the timing of those distributed state transitions, or the like. Embodiments of coverage presentation 312 will be described below in greater detail.

Figure 4:
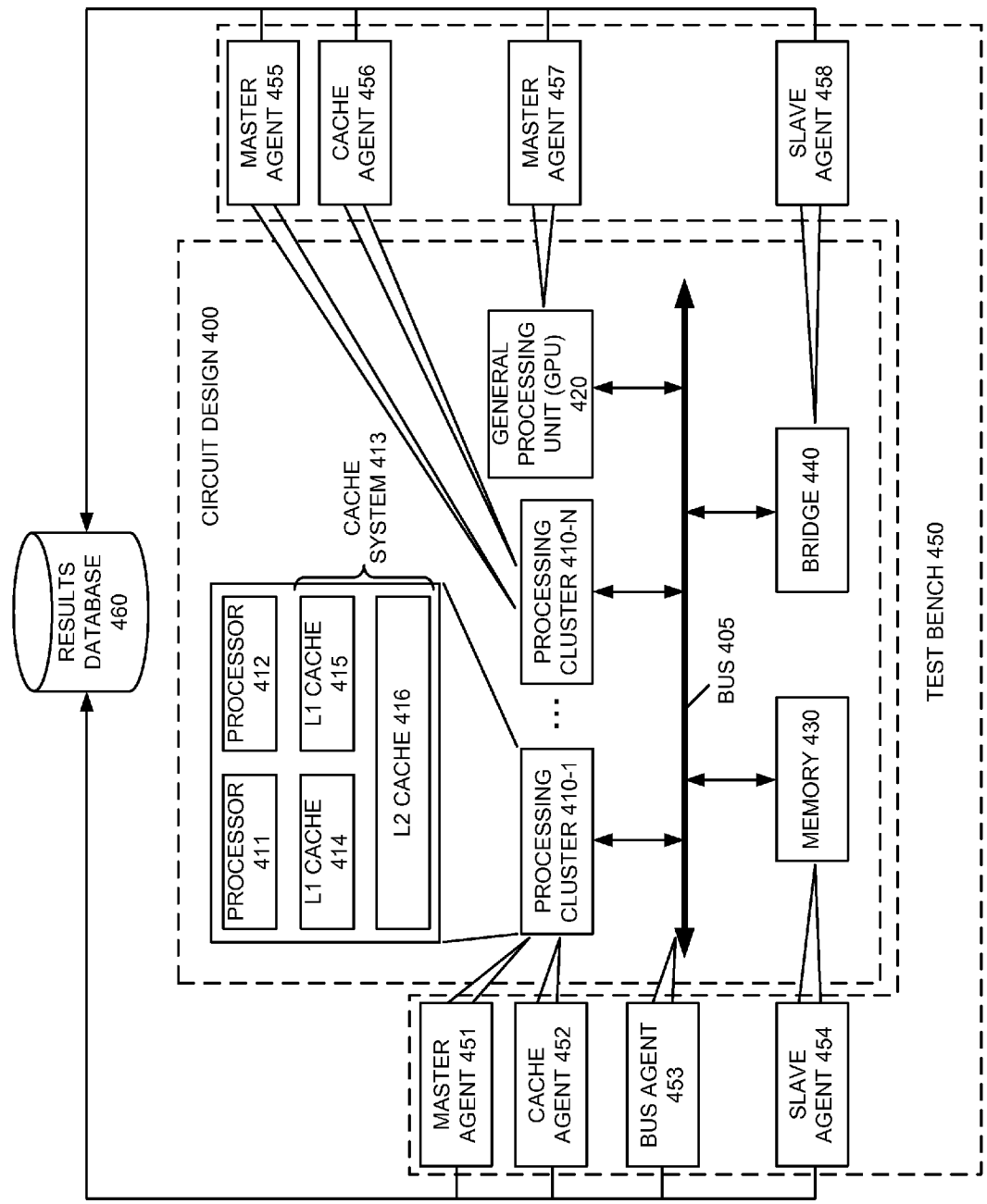
FIG. 4 illustrates an example implementation of simulation data capture in a circuit design according to various embodiments of the invention.

FIG. 4 illustrates an example implementation of simulation data capture in a circuit design 400 according to various embodiments of the invention. Referring to FIG. 4, the circuit design 400 can include multiple master components, such as processing clusters 410-1 to 410-N, general processing unit (GPU) 420, or the like, and multiple slave components, such as memory 430, bridge 440, or the like, to communicate with each other over a bus 405.

The processing clusters 410-1 to 410-N can each include multiple processors and a cache system to store data, for example, from the memory 430, for utilization by the processors. For example, the processing cluster 410-1 can include processors 411 and 412, and a cache system 413 having level-1 (L1) caches 414 and 415 and a level-2 (L2) cache 416 available to store data for use by the processors 411 and 412. The processing clusters 410-1 to 410-N can implement a cache coherency protocol, such as MSI, MESI, MOESI, MERSI, MESIF, write-once, or the like, to ensure consistency of data stored in the different caches from a common physical address of a shared resource, such as the memory 430.

During simulation of the circuit design 400, a test bench 450 can provide input vectors to the circuit design 400, which can prompt the circuit design 400 to perform various operations. The test bench 450 can include various monitoring modules to monitor data transactions or other events in the circuit design 400 that were prompted by the input vectors from the test bench 450 and to record them in a results database 460. The monitoring modules can include master agents 451, 455, and 457 to monitor master devices, such as the processing clusters 410-1 to 410-N and the GPU 420, include cache agents 452 and 456 to monitor or mirror the cache systems in the processing clusters 410-1 to 410-N, respectively, include a bus agent 453 to monitor the bus 405, and include slave agents 454 and 458 to monitor slave devices, such as the memory 430 and the bridge 440. Each of the monitoring modules can record monitored information or simulation data, such as data transactions, events, interrupts, cache operational states, or the like, to a results database 460. In some embodiments, a design verification tool, such as the design verification tool 301 shown FIG. 3, can access the results database 460 to analyze and possibly correlate information stored therein to perform distributed state functional coverage.

Figure 5:
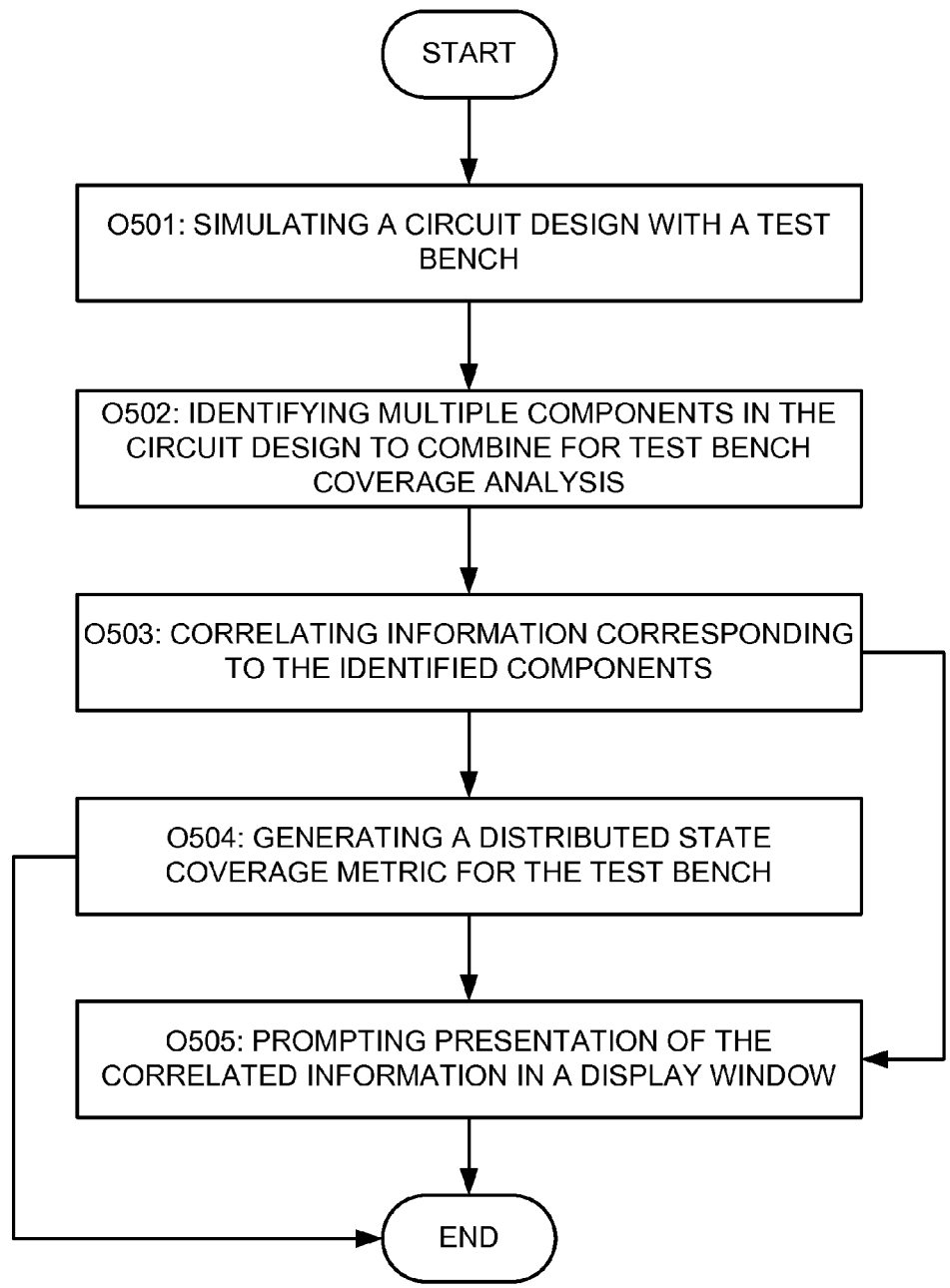
FIG. 5 illustrates a flowchart showing an example implementation of distributed state functional coverage according to various examples of the invention.

FIG. 5 illustrates a flowchart showing an example implementation of distributed state functional coverage according to various examples of the invention. Referring to FIG. 5, in a block 501, a design verification tool can simulate a circuit design with a test bench. The design verification tool can capture, during simulation of the circuit design, simulation data for the components in the circuit design. In some embodiments, the simulation data can include operational states of the components in the circuit design, data transactions prompting transitions between the operational states for the components, or the like.

In a block 502, the design verification tool can identify multiple components in the circuit design to combine for distributed state coverage analysis based, at least in part, on the data transactions generated during the simulation of the circuit design. In some embodiments, the design verification tool can review or analyze data transactions to determine when multiple components become functionally-interrelated, for example, when multiple caches share data from a common physical address in a memory device of the circuit design with at least some overlap in time or when different entries in one or more hardware linked-list store data from data transactions, or the like.

In a block 503, the design verification tool can correlate information captured during simulation that corresponds to the identified components. The correlated information is configured to identify at least one distributed state coverage event for the test bench. In some embodiments, the correlated information can include operational states for the identified components that, when combined based on their previously determined functional-interrelation, become distributed states. The correlated information also can include data transactions or events in the simulation data 306 that prompted the circuit design to transition into the distributed state, the timing of those data transactions or events relative to other data transactions or events in the simulation data 306, or the like.

In a block 504, the design verification tool can generate a distributed state coverage metric configured to quantify the distributed state functional coverage for the identified components based, at least in part, on the correlated information for the identified components. In some embodiments, the distributed state coverage metrics can be a percentage of or an indication of whether components became functionally-interrelated during simulation, a percentage of the distributed states the functionally-interrelated components in the circuit design completely and/or partially covered during simulation with the test bench, or the like. The distributed state coverage metric can be utilized to determine whether the test bench satisfies a predetermine specification.

In a block 505, the design verification tool can prompt presentation of the correlated information corresponding to the identified components in a display window. In some embodiments, the presentation can be a table or graphical display populated with simulation data corresponding to components in the circuit design that became functionally-interrelated during simulation. The correlated information can include the distributed states the functionally-interrelated components covered during simulation, the events prompting transition into the corresponding distributed states, the timing of those distributed state transitions or data transactions, or the like.

Figure 6:
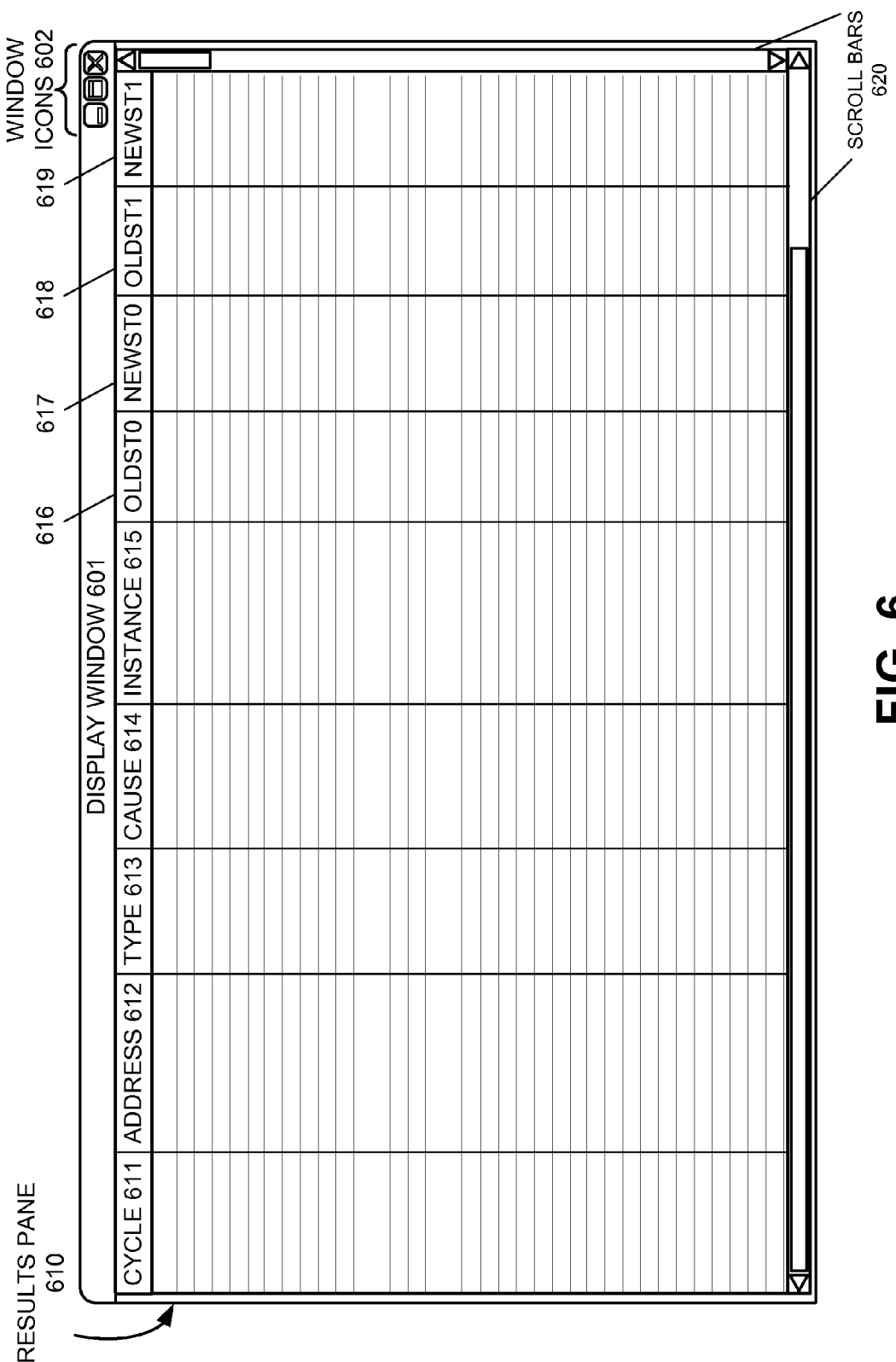
FIG. 6 illustrates an example display window to present correlated information for distributed state functional coverage according to various embodiments of the invention.

FIG. 6 illustrates an example display window to present correlated information for distributed state functional coverage according to various embodiments of the invention. Referring to FIG. 6, a design verification tool, such as design verification tool 301 shown in FIG. 3, can prompt presentation of simulation data for multiple components in a display window 601. The display window 601 can include a results pane 610 to include a list of simulation data, which can correspond to output from a circuit design simulated with a test bench. In some embodiments, the results pane 610 can be arranged in a row-column format, with the rows corresponding to different data transactions in the simulation data and the columns including various attributes of the simulation.

The results pane 610 can include a cycle 611 column, which can identify a clock cycle corresponding to a signal or transaction in a corresponding row. The results pane 610 can include an address 612 column, which can identify a physical address in a memory device corresponding to the signal or transaction in the corresponding row. The results pane 610 can include a type 613 column, which can identify a type of signal or transaction in the corresponding row, such as a read, write, evict, snoop, or the like. The results pane 610 can include a cause 614 column, which can identify a specific signal or transaction in a corresponding row within the category identified in the type 613 column that caused a distributed state transition. The results pane 610 can include an instance 615 column, which can identify a cache or other component that changed operational state in response to the command identified in the type 613 and cause 614 columns. The results pane 610 can include a group of columns 616-619, which can identify a combined or distributed state for multiple interrelated caches or components. In some embodiments, the combined state for the multiple interrelated caches or components can include an old state for a first cache (OLDST0) 616 column, a new state for the first cache (NEWST0) 617 column, an old state for a second cache (OLDST1) 618 column, and a new state for the second cache (NEWST1) 619 column.

The results pane 610 can include scroll bars 620, that, when selected or moved, for example, in response to user input, can adjust the results pane 610 to rendered different portions of the results pane 610 viewable in the display window 601. The display window 601 also can include window icons 602, which can control sizing of the display window 601, such as enlarging, shrinking, minimizing, or the like, and closing of the display window 601.

Figure 7A:
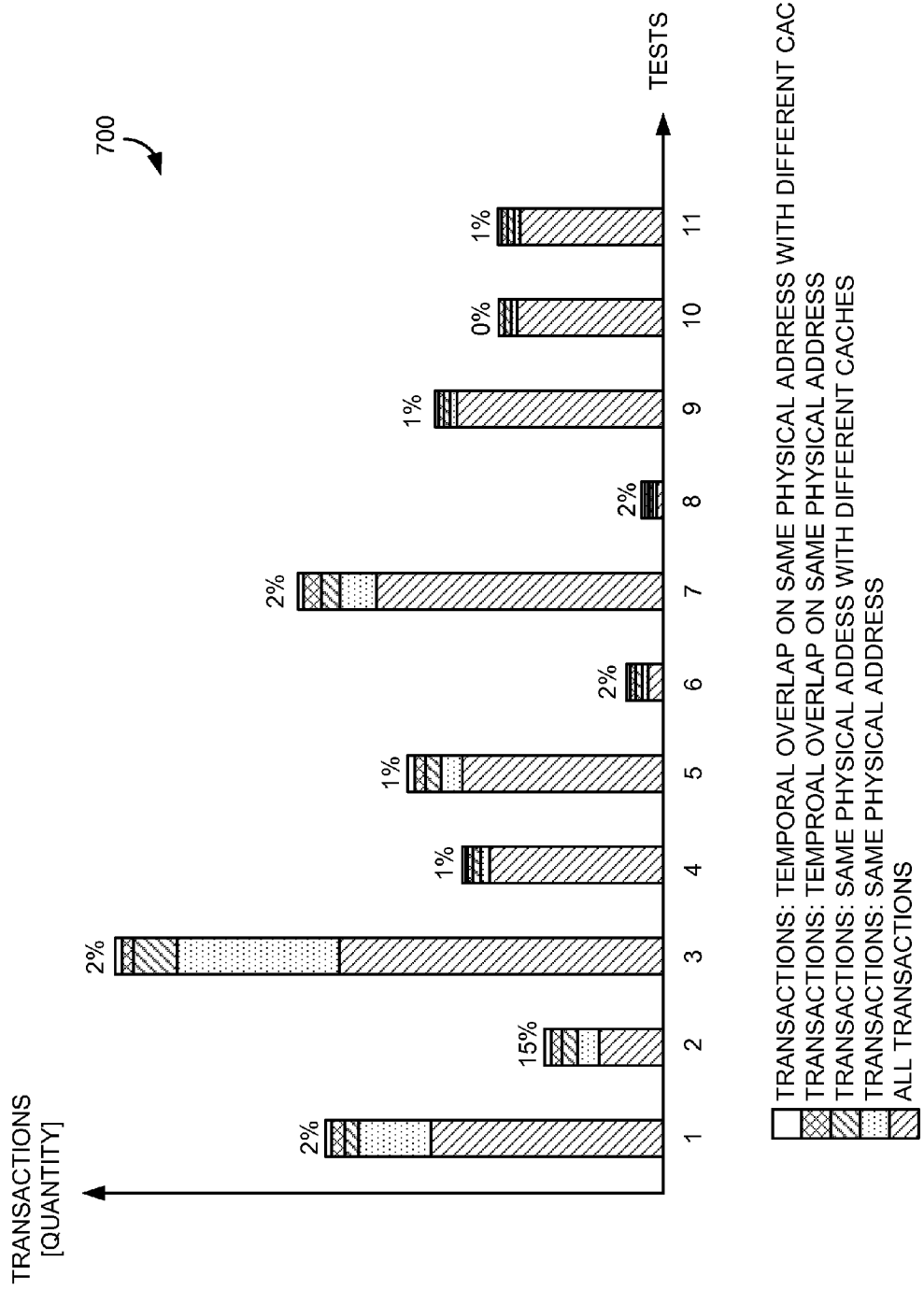
FIGS. 7A-7D illustrate example presentations of distributed state functional coverage events viewable in a display window according to various embodiments of the invention.

FIGS. 7A-7D illustrate example presentations of distributed state functional coverage events viewable in a display window according to various embodiments of the invention. Referring to FIG. 7A, a histogram 700 can provide a representation of data transactions captured during at least one simulation of a circuit design. The histogram 700 can organize the transactions into various bins, for example, along the x-axis. In some embodiments, when the simulation of the circuit design includes multiple different tests, each of the bins can be associated with a different test.

Each bin in the histogram 700 can have a bar, for example, extending in the y-direction, the length of which can correspond to the number of data transactions captured in the particular test associated with each bin. The histogram 700 can sub-divide each of these bars into different groups to illustrate data transactions having different contexts within a total number of data transactions captured in the particular test. The histogram 700 can annunciate the different data transaction contexts, for example, by shading, coloring, texturing, patterning, highlighting, or the like, the different groups in the bars.

In some examples, a first group of data transactions in the histogram 700 can correspond to all data transactions for each test. A second group of data transactions in the histogram 700 can be a subset of the first group, which can correspond to any data transaction utilizing a same physical address in memory as another data transaction in the same test.

A third group of data transactions in the histogram 700 can be a subset of the second group, which can correspond to data transactions utilizing the same physical address in memory as well as those data transaction being associated with different caches in the circuit design. A fourth group of data transactions in the histogram 700 can be a subset of the second group, which can correspond to data transactions utilizing the same physical address in memory as well as those data transaction being temporally overlapped with each other. In some embodiments, the temporal overlap can correspond to a data transaction associated with a physical address in memory, while a cache stores data corresponding to that physical address or another data transaction for that physical address is or recently has been processed.

A fifth group of data transactions can in the histogram 700 be a common subset of the third and fourth groups, which can correspond to any data transactions for different caches in the circuit design that both overlap temporally and correspond to data from a same physical address in memory as another data transaction in the same test. The data transactions in this fourth group can correspond to one or more distributed state functional coverage events, for example, which could exercise a cache coherency protocol in the circuit design. The histogram 700 also can display a percentage of the data transactions categorized into the fourth group relative all transactions for each test. The representation of the data transactions by the histogram 700 can allow test bench designers to appreciate how well their test benches came to covering coherent caches or other components in the circuit design whose operational states can be dependent on data from data transactions.

Figure 7B:
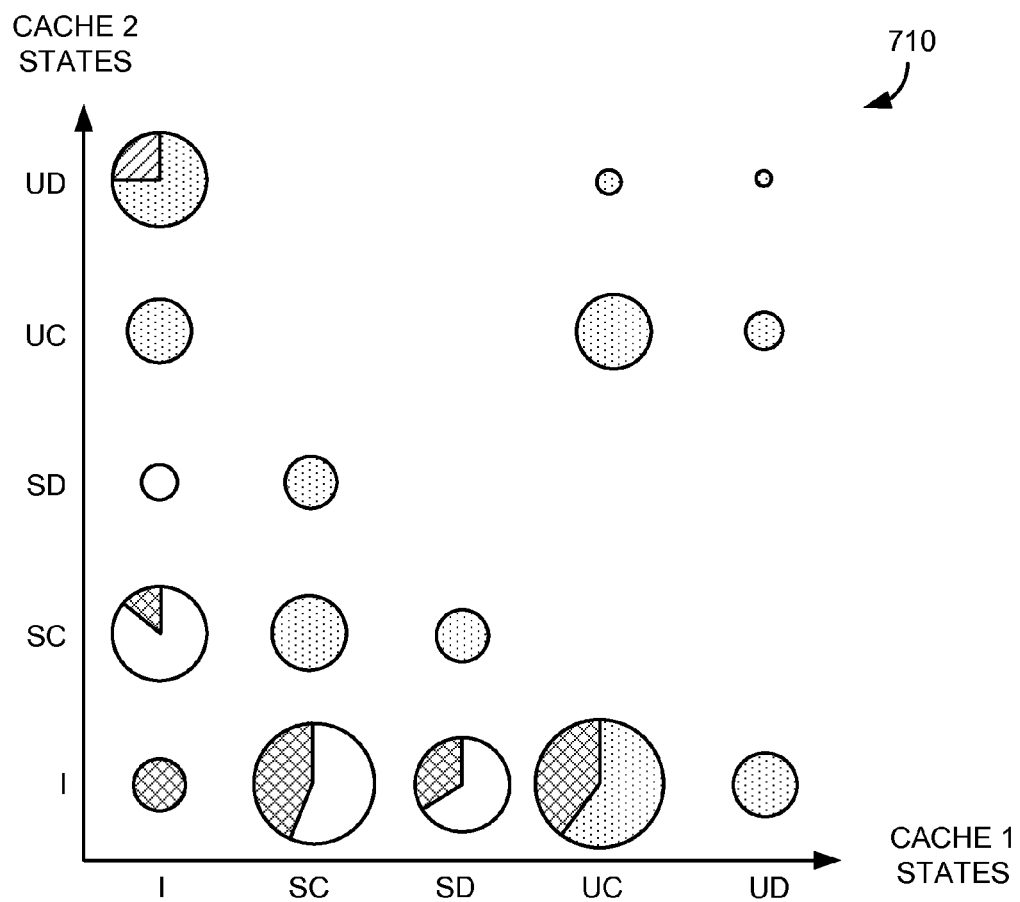

Referring to FIG. 7B, a chart 710 can provide a representation of distributed state coverage for a pair of caches in a circuit design. The chart 710 can have various operational states for a first cache along the x-axis, and various operational states for a second cache along the y-axis. For example, the first and second caches can each enter an invalid (I) state, a shared clean (SC) state, a shared dirty (SD) state, a unique clean (UC) state, and a unique dirty (UD) state. The chart 710 can plot, for example, in a bubble representation, indicators of distributed state coverage events for the first and second caches, i.e., while the first and second caches share a common physical address in a memory device of the circuit design.

In some examples, the chart 710 can illustrate a frequency of entering the distributed states during simulation with a size of the indicators. The chart 710 can annunciate which data transactions prompted a transition into the distributed states for the pair of caches, for example, by shading, coloring, texturing, patterning, highlighting, or the like, one or more sections in the indicators. The chart 710 can annunciate a frequency for each data transaction that prompted a transition into the distributed states for the pair of caches with a size of the one or more sections in the indicators. Although FIG. 7B shows distributed state coverage events for a pair of caches in the circuit design, in some embodiments, any pair of components in the circuit design can be presented in a chart similar to the chart 710.

The chart 710 can present information corresponding to whether the test bench effectively covered a pair of coherent caches, i.e., entered each distributed state in response to each possible data transaction while the pair of caches shared data from a common physical address in memory. The chart 710 also can show whether the pair of coherent caches entered an "illegal state", such as when both the first and second caches are in a unique dirty state.

Figure 7C:
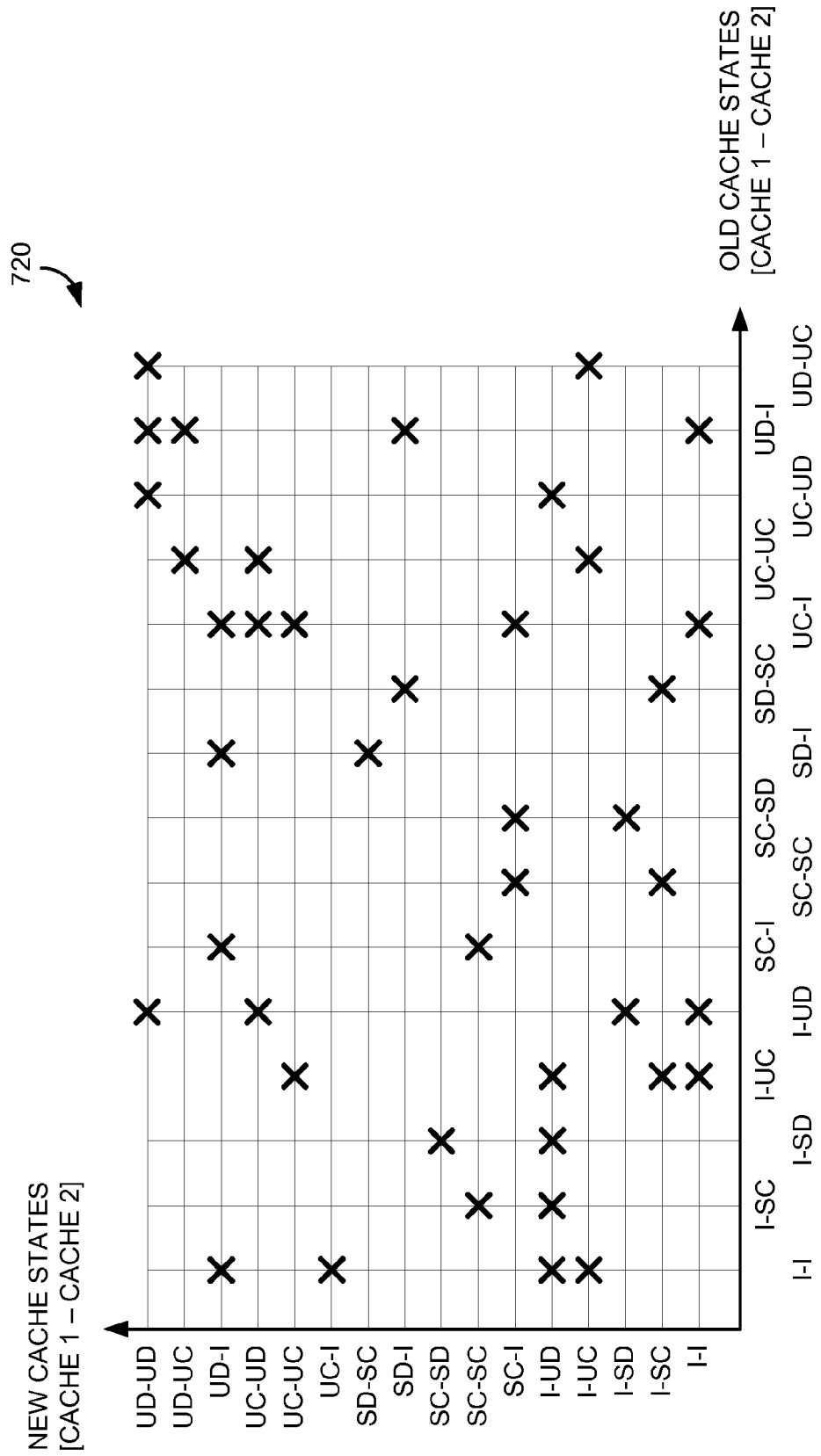

Referring to FIG. 7C, a chart 720 can illustrate distributed state transition for a pair of caches in a circuit design. The chart 720 can present "old" distributed states for the pair of caches along the x-axis, and "new" distributed states for the pair of caches along the y-axis. For example, the pair of caches can each enter an invalid (I) state, a shared clean (SC) state, a shared dirty (SD) state, a unique clean (UC) state, and a unique dirty (UD) state. The chart 720 can plot indicators of distributed state transitions for the pair of caches, i.e., while the pair of caches share a common physical address in a memory device of the circuit design.

The chart 720 can present information corresponding to whether the test bench effectively covered a pair of coherent caches, i.e., entered each distributed state from every possible previous distributed state, while the pair of caches shared data from a common physical address in memory. The chart 710 also can show whether the pair of coherent caches entered an "illegal state" or made an illegal distributed state transition.

In some examples, the chart 720 can illustrate a frequency of the distributed state transitions during simulation, for example, with shading, coloring, texturing, patterning, highlighting, depth, or the like, of the indicators. In some examples, the chart 720 can illustrate which data transactions prompted distributed state transitions during simulation with a size of the indicators, for example, with shading, coloring, texturing, patterning, highlighting, depth, or the like, of the indicators. Although FIG. 7C shows distributed states transitions for a pair of caches in the circuit design, in some embodiments, any pair of components in the circuit design can be presented in a chart similar to the chart 720.

Figure 7D:
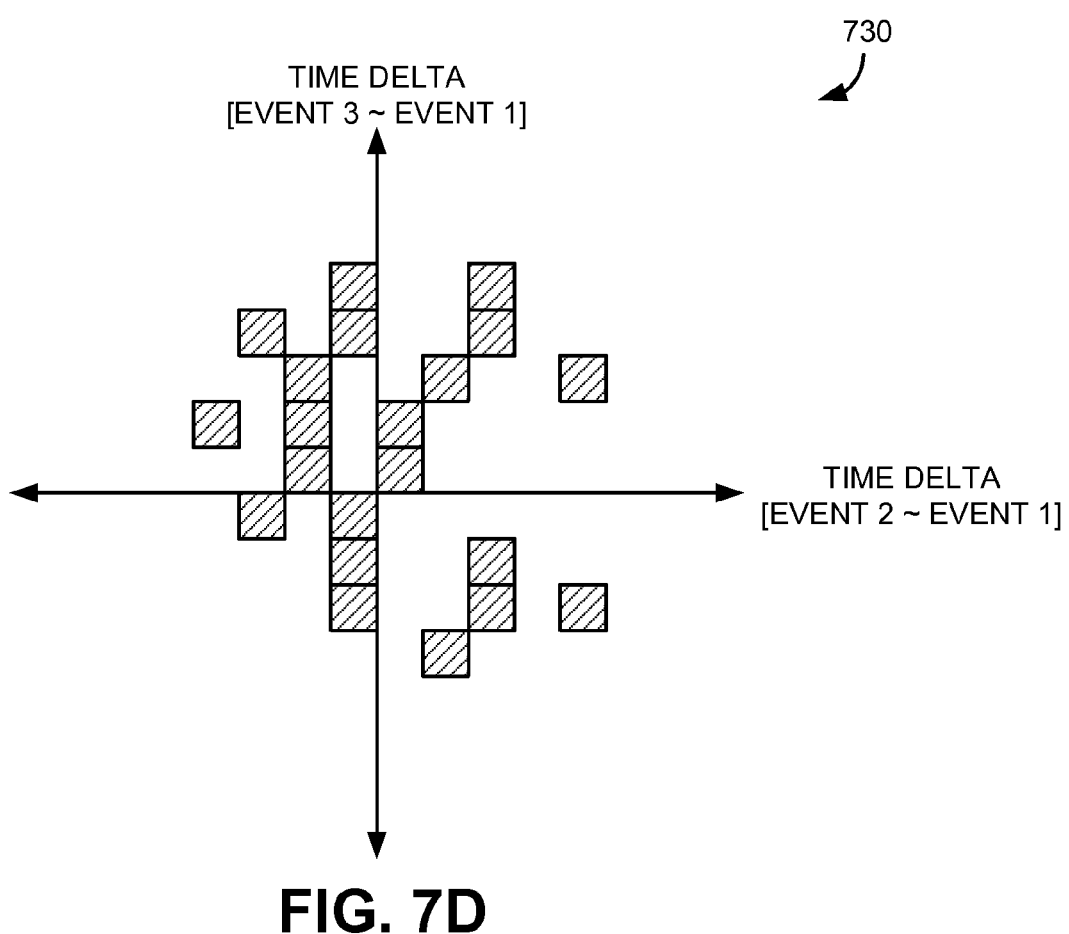

Referring to FIG. 7D, a chart 730 can illustrate timing for multiple events occurring during simulation of a circuit design. In some embodiments, the multiple events can include data transactions that prompt distributed state coverage events for multiple components in the circuit design.

The chart 730 can have an occurrence of a first event situated on a point (0,0) of an x-y plot, such as a system interrupt, data transaction, or the like. The x-y plot can have an x-axis corresponding to a time difference between a second event relative to the first event, and have a y-axis corresponding to a time difference between a third event relative to the first event. In some examples, the second and third events can correspond to data transactions that prompt distributed state coverage events for the multiple components in the circuit design, and when they occurred relative to the first event. The distributed state functional coverage can be considered fully covered for a pair of components in the circuit design when the pair of components enter each distributed state in response to each possible data transaction, which includes each possible timing position in the x-y plot.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   correlating, by a computing system, transactions captured during simulation of a circuit design to distributed states for multiple components in the circuit design, wherein the distributed states for the multiple components correspond to operational states of the multiple components while the multiple components are functionally-interrelated during the simulation of the circuit design;
   identifying, by the computing system, at least a portion of the distributed states for the multiple components correspond to system level coverage events; and
   generating, by the computing system, a graphical presentation to illustrate the portion of the distributed states for the multiple components in the circuit design that correspond to system level coverage events.

2. The method of claim 1, wherein the graphical presentation is configured to include a representation of the transactions captured during the simulation of the circuit design, and wherein the representation of the transactions is configured to distinguish a set of the transactions that correspond to the system level coverage events from the rest of the transactions.

3. The method of claim 2, wherein the graphical presentation includes a value configured to indicate a percentage of the transactions that are associated with the set of the transactions corresponding to the system level coverage events.

4. The method of claim 1, wherein the graphical presentation is configured to include a representation of the distributed states corresponding to a selected set of the multiple components in the circuit design.

5. The method of claim 4, wherein the representation of the distributed states corresponding to the selected set of the multiple components is configured to illustrate types of the transactions that prompted the selected set of the multiple components to transition into the distributed states.

6. The method of claim 4, wherein the representation of the distributed states corresponding to the selected set of the multiple components is configured to illustrate a relationship between the distributed states of the selected set of the multiple components and corresponding prior distributed states for the selected set of the multiple components.

7. The method of claim 4, wherein the representation of the distributed states corresponding to the selected set of the multiple components is configured to illustrate a relative timing of the transactions prompting the multiple components in the selected set to transition between their corresponding distributed states.

8. An apparatus comprising at least one computer-readable memory device storing instructions configured to cause one or more processing devices to perform operations comprising:
   correlating transactions captured during simulation of a circuit design to distributed states for multiple components in the circuit design, wherein the distributed states for the multiple components correspond to operational states of the multiple components while the multiple components are functionally-interrelated during the simulation of the circuit design;
   identifying at least a portion of the distributed states for the multiple components correspond to system level coverage events; and
   generating a graphical presentation to illustrate the portion of the distributed states for the multiple components in the circuit design that correspond to system level coverage events.

9. The apparatus of claim 8, wherein the graphical presentation is configured to include a representation of the transactions captured during the simulation of the circuit design, and wherein the representation of the transactions is configured to distinguish a set of the transactions that correspond to the system level coverage events from the rest of the transactions.

10. The apparatus of claim 9, wherein the graphical presentation includes a value configured to indicate a percentage of the transactions that are associated with the set of the transactions corresponding to the system level coverage events.

11. The apparatus of claim 8, wherein the graphical presentation is configured to include a representation of the distributed states corresponding to a selected set of the multiple components in the circuit design.

12. The apparatus of claim 11, wherein the representation of the distributed states corresponding to the selected set of the multiple components is configured to illustrate types of the transactions that prompted the selected set of the multiple components to transition into the distributed states.

13. The apparatus of claim 11, wherein the representation of the distributed states corresponding to the selected set of the multiple components is configured to illustrate a relationship between the distributed states of the selected set of the multiple components and corresponding prior distributed states for the selected set of the multiple components.

14. The apparatus of claim 11, wherein the representation of the distributed states corresponding to the selected set of the multiple components is configured to illustrate a relative timing of the transactions prompting the multiple components in the selected set to transition between their corresponding distributed states.

15. A system comprising:
a memory system configured to store computer-executable instructions; and
a computing system, in response to execution of the computer-executable instructions, is configured to:
correlate transactions captured during simulation of a circuit design to distributed states for multiple components in the circuit design, wherein the distributed states for the multiple components correspond to operational states of the multiple components while the multiple components are functionally-interrelated during the simulation of the circuit design;
identify at least a portion of the distributed states for the multiple components correspond to system level coverage events; and
generate a graphical presentation to illustrate the portion of the distributed states for the multiple components in the circuit design that correspond to system level coverage events.

16. The system of claim 15, wherein the graphical presentation is configured to include a representation of the transactions captured during the simulation of the circuit design, and wherein the representation of the transactions is configured to distinguish a set of the transactions that correspond to the system level coverage events from the rest of the transactions.

17. The system of claim 16, wherein the graphical presentation includes a value configured to indicate a percentage of the transactions that are associated with the set of the transactions corresponding to the system level coverage events.

18. The system of claim 15, wherein the graphical presentation is configured to include a representation of the distributed states corresponding to a selected set of the multiple components in the circuit design, which illustrates types of the transactions that prompted the selected set of the multiple components to transition into the distributed states.

19. The system of claim 15, wherein the graphical presentation is configured to include a representation of the distributed states corresponding to a selected set of the multiple components in the circuit design, which illustrates a relationship between the distributed states of the selected set of the multiple components and corresponding prior distributed states for the selected set of the multiple components.

20. The system of claim 15, wherein the graphical presentation is configured to include a representation of the distributed states corresponding to a selected set of the multiple components in the circuit design, which illustrates a relative timing of the transactions prompting the multiple components in the selected set to transition between their corresponding distributed states.

* * * * *